United States Patent
Das et al.

(10) Patent No.: US 9,970,757 B2
(45) Date of Patent: May 15, 2018

(54) METHOD AND APPARATUS FOR POSITIONING WITH ALWAYS ON BAROMETER

(71) Applicant: QUALCOMM Incorporated, San Diego, CA (US)

(72) Inventors: Saumitra Mohan Das, Santa Clara, CA (US); Faraz Mohammad Mirzaei, San Jose, CA (US)

(73) Assignee: QUALCOMM Incorporated, San Diego, CA (US)

( * ) Notice: Subject to any disclaimer, the term of this patent is extended or adjusted under 35 U.S.C. 154(b) by 566 days.

(21) Appl. No.: 14/272,892

(22) Filed: May 8, 2014

(65) Prior Publication Data

US 2015/0192414 A1 Jul. 9, 2015

Related U.S. Application Data

(60) Provisional application No. 61/925,120, filed on Jan. 8, 2014.

(51) Int. Cl.
*G01C 5/06* (2006.01)
*H03K 17/94* (2006.01)
*G06F 1/26* (2006.01)

(52) U.S. Cl.
CPC .......... *G01C 5/06* (2013.01); *G06F 1/26* (2013.01); *H03K 17/94* (2013.01)

(58) Field of Classification Search
CPC .......... G01C 5/06; G01C 21/00; G01S 5/0009
USPC ............................................. 73/384; 702/138
See application file for complete search history.

(56) References Cited

U.S. PATENT DOCUMENTS

| | | | |
|---|---|---|---|
| 2006/0271797 A1 | 11/2006 | Ginggen et al. | |
| 2007/0133012 A1 | 6/2007 | Euler | |
| 2009/0286556 A1* | 11/2009 | Yumoto | G01C 21/20 455/456.6 |
| 2010/0198509 A1 | 8/2010 | Orsatti et al. | |

(Continued)

FOREIGN PATENT DOCUMENTS

| | | | |
|---|---|---|---|
| CN | 1856692 A | 11/2006 | |
| DE | 102009002314 A1 * | 7/2010 | G01C 5/06 |

(Continued)

OTHER PUBLICATIONS

Google translation of Beer et al. (DE 102009002314 A1).*

(Continued)

*Primary Examiner* — Lisa Caputo
*Assistant Examiner* — Nathaniel T Woodward
(74) *Attorney, Agent, or Firm* — Kilpatrick Townsend & Stockton, LLP

(57) ABSTRACT

Methods, apparatuses, and non-transitory processor-readable media of the present disclosure are presented for efficiently executing applications based on pressure sensor data. In some embodiments, a method includes monitoring pressure, and determining a rate of change in the pressure over time exceeds a predetermined rate-of-pressure-change threshold. The method further includes subsequently determining that the rate of change in the pressure over time no longer exceeds the predetermined rate-of-pressure-change threshold. The method further includes determining a change in pressure has exceeded a predetermined pressure-change threshold, and performing floor disambiguation.

30 Claims, 8 Drawing Sheets

(56) References Cited

U.S. PATENT DOCUMENTS

| | | | | |
|---|---|---|---|---|
| 2010/0313050 A1* | 12/2010 | Harrat | ............... | G06F 1/3203 |
| | | | | 713/323 |
| 2011/0215952 A1* | 9/2011 | Aria | ............... | G06F 3/017 |
| | | | | 341/20 |
| 2012/0100895 A1 | 4/2012 | Priyantha et al. | | |
| 2012/0290253 A1* | 11/2012 | Barrett | ............... | G01C 5/06 |
| | | | | 702/150 |
| 2013/0007936 A1* | 1/2013 | Levine | ............... | A42B 3/046 |
| | | | | 2/6.6 |
| 2013/0116966 A1 | 5/2013 | D'Jesus et al. | | |
| 2014/0059365 A1* | 2/2014 | Heo | ............... | G06F 1/3206 |
| | | | | 713/320 |

FOREIGN PATENT DOCUMENTS

| | | |
|---|---|---|
| DE | 102009002314 A1 | 7/2010 |
| EP | 1990607 A1 | 11/2008 |
| JP | 2004264120 A | 9/2004 |
| WO | 2012052766 A2 | 4/2012 |
| WO | 2012065184 A2 | 5/2012 |

OTHER PUBLICATIONS

Partial International Search Report—PCT/US2014/072045—ISA/EPO—Apr. 8, 2015.

Ra M.R., et al., "Improving Energy Efficiency of Personal Sensing Applications with Heterogeneous Multi-Processors," In the 14th International Conference on Ubiquitous Computing (UBICOMP), 2012, 10 Pages.

International Search Report and Written Opinion—PCT/US2014/072045—ISA/EPO—Sep. 11, 2015.

\* cited by examiner

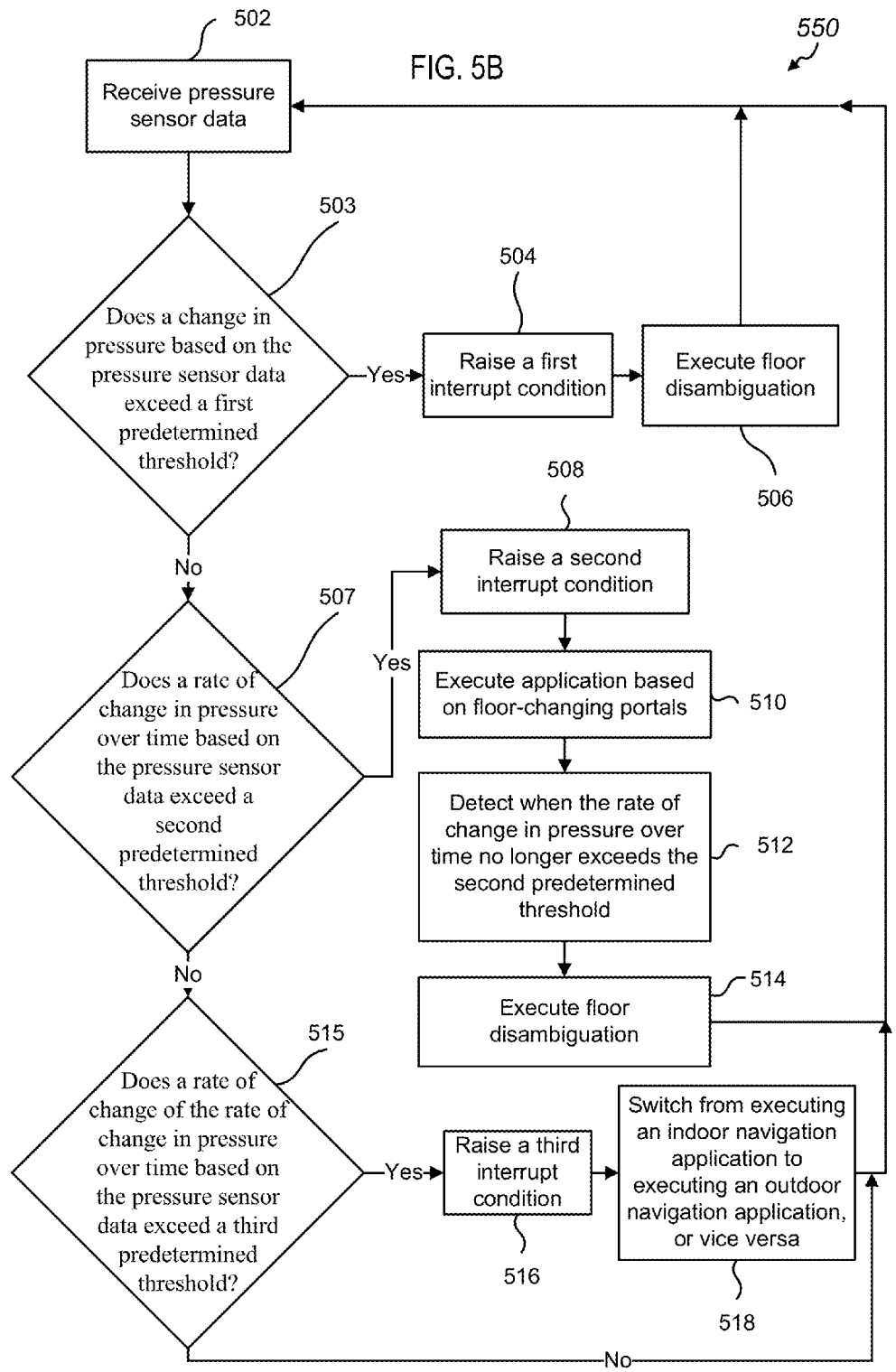

METHOD AND APPARATUS FOR POSITIONING WITH ALWAYS ON BAROMETER

This application claims priority from U.S. Provisional Application Ser. No. 61/925,120, filed on Jan. 8, 2014, and entitled "METHOD AND APPARATUS FOR POSITIONING WITH ALWAYS ON BAROMETER."

FIELD

The present disclosures generally relate to utilizing pressure sensor readings in an energy and time-efficient manner.

BACKGROUND

In a device, such as a mobile device, pressure-related measurements, e.g., pressure sensor readings from a barometer, can be useful for a variety of applications, such as determining a traversed path or determining what floor a device is on. However, monitoring pressure by a generalized application processor can be rather power intensive.

Thus, new designs or techniques utilizing pressure sensor readings are desirable.

BRIEF SUMMARY

Methods and systems are presented for utilizing pressure sensor data, such as barometer readings, in various applications in an energy and time-efficient manner.

In some embodiments, a method is presented for detecting altitude or floor changes, for example, on a mobile device. The method may include monitoring pressure, and determining a rate of change in the pressure over time exceeds a predetermined rate-of-pressure-change threshold. The method may further include subsequently determining that the rate of change in the pressure over time no longer exceeds the predetermined rate-of-pressure-change threshold, determining a change in pressure has exceeded a predetermined pressure-change threshold. The method may further include, and performing floor disambiguation.

In some embodiments, the method may further include receiving a time-to-live (TTL) validity period associated with the change in pressure, determining that the TTL validity period associated with the change in pressure has expired, and disregarding the rate of change in the pressure and the change in pressure.

In some embodiments, the method may further include determining the mobile device is located in an indoor venue, and performing floor disambiguation.

In some embodiments, the method may further include determining a velocity of the mobile device exceeds a velocity threshold, and disregarding the pressure.

In some embodiments, monitoring the pressure over time, determining the rate of change in the pressure over time exceeds the predetermined rate-of-pressure-change threshold, subsequently determining that the rate of change in the pressure over time no longer exceeds the predetermined rate-of-pressure-change threshold, and determining the change in pressure has exceeded the predetermined pressure-change threshold are performed using a sensor core. In some embodiments, the floor disambiguation is performed using an application core, wherein the sensor core uses less power than the application core.

In some embodiments, the floor disambiguation is performed using data from a pressure sensor. In some embodiments, the floor disambiguation is performed using data received from one or more terrestrial wireless transceivers In some embodiments, an apparatus is presented. The apparatus may include a sensor core configured to monitor pressure, determine a rate of change in the pressure over time exceeds a predetermined rate-of-pressure-change threshold, subsequently determine that the rate of change in the pressure over time no longer exceeds the predetermined rate-of-pressure-change threshold, and determine a change in pressure has exceeded a predetermined pressure-change threshold. The apparatus may also include an application core configured to perform floor disambiguation.

In some embodiments, another apparatus is presented. The apparatus may include means for monitoring pressure, and means for determining a rate of change in the pressure over time exceeds a predetermined rate-of-pressure-change threshold. The apparatus may further include means for subsequently determining that the rate of change in the pressure over time no longer exceeds the predetermined rate-of-pressure-change threshold, means for determining a change in pressure has exceeded a predetermined pressure-change threshold, and means for performing floor disambiguation.

In some embodiments, a non-transitory processor-readable medium is presented. The non-transitory process-readable medium may include processor-readable instructions, comprising: code for monitoring pressure; code for determining a rate of change in the pressure over time exceeds a predetermined rate-of-pressure-change threshold; code for subsequently determining that the rate of change in the pressure over time no longer exceeds the predetermined rate-of-pressure-change threshold; code for determining a change in pressure has exceeded a predetermined pressure-change threshold; and code for performing floor disambiguation

BRIEF DESCRIPTION OF THE DRAWINGS

An understanding of the nature and advantages of various embodiments may be realized by reference to the following figures. In the appended figures, similar components or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

FIG. 5B illustrates an example flowchart illustrating a method according to some embodiments.

DETAILED DESCRIPTION

Figure 1:
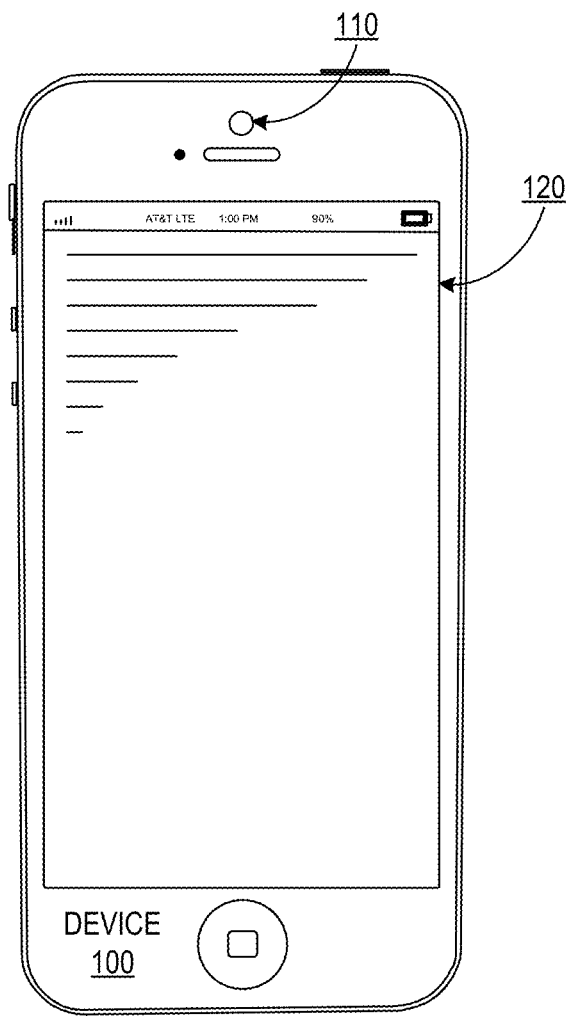
FIG. 1 is an example device that may implement various embodiments of the present disclosures.

Several illustrative embodiments will now be described with respect to the accompanying drawings, which form a part hereof. While particular embodiments, in which one or more aspects of the disclosure may be implemented, are described below, other embodiments may be used and various modifications may be made without departing from the scope of the disclosure or the spirit of the appended claims.

Methods and apparatuses are presented for utilizing barometer readings in applications in an energy and time-efficient manner. Utilizing barometer readings in a device for various applications and purposes can be power intensive, as continuous sampling for barometer readings can require large amounts of power. New designs or techniques to utilize barometer measurements, while enabling the same or even faster rates of sampling, are desirable.

Aspects of the present disclosures include methods for efficiently sampling barometer measurements and executing various applications based on certain patterns found in the barometer measurements. For example, in some embodiments, floor disambiguation techniques may be executed when it is determined that pressure sensor data based on, for example, barometer measurements, has changed sufficiently beyond some predetermined threshold. As used herein, a floor disambiguation technique may refer to a program or application that determines a floor or altitude at which a mobile device is located. Using the determined floor or altitude, the floor disambiguation technique may retrieve a map or other reference information that corresponds to the determined floor or altitude. Further details regarding floor disambiguation techniques will be described below. In some cases, an application related to means for changing floors, e.g., stairs, elevators, escalators, etc. (the collective of which may be referred to herein as "floor-changing portals") may be triggered when it is determined that the rate of change over time (the first derivative) of the pressure sensor data has changed sufficiently beyond another predetermined threshold. Other applications based on other patterns observed in the pressure sensor data may be executed and are within the scope of the present disclosures. These and other examples will be described in more detail, below.

Other aspects of the present disclosures include a new processor design for efficiently sampling barometer measurements while still allowing for applications to access the barometer measurements. In some embodiments, an apparatus includes a processor containing at least two cores. In some embodiments, each of the functions performed by the cores described below can be performed on two separate processors. A first core or processor is configured to execute or operate applications, while a second core or processor is configured to detect and record barometer measurements and its patterns. The second core or processor may not run applications. In some embodiments, the second core or processor requires substantially less power than the first core or processor running the applications (e.g. ~10× less power). In some embodiments, the first core or processor and second core or processor are configured to communicate with each other in specific ways that are power and energy efficient. Examples will be described in more detail below.

Referring to FIG. 1, example computing device 100 may be configured to implement one or more aspects of the disclosure. For example, computing device 100 may be a smart phone, tablet computer, personal digital assistant, or other mobile device that is equipped with one or more sensors that allow computing device 100 to barometric readings or other pressure data (e.g., air pressure, or the like) as a form of input. In some embodiments, computing device 100 is not a mobile device, and may be, for example, a desktop computer, a gaming machine, a stationary sensor or camera, or a system of machines coupled together wirelessly or wired. Computing device 100 may be equipped with, be communicatively coupled to, and/or otherwise include one or more pressure sensors, such as one or more barometers, altimeters, and/or other sensors. In addition to including one or more sensors, computing device 100 also may include one or more processors, memory units, and/or other hardware components, as described in greater detail below.

In one or more arrangements, computing device 100 may use any and/or all of these sensors alone or in combination to measure barometric pressure or obtain other pressure data. For example, computing device 100 may use one or more barometers to obtain pressure data at the altitude of computing device 100. In addition, changes in altitude may be determined using the one or more barometers, based on the change in pressure data obtained between two substantially contemporaneous points in time. As a more complex example, one or more processors in combination with one or more barometers in computing device 100 may be used to determine by what means a user of the computing device 100 is changing altitude, such as by an elevator, escalator, or stairs. While these sample barometric readings and uses are described here as examples, any other sort of pressure data obtained by a computing device 100, whether through one or more sensors in computing device 100, or through wireless means or wired means, may be considered as part of implementing one or more aspects of the disclosure.

Figure 2:
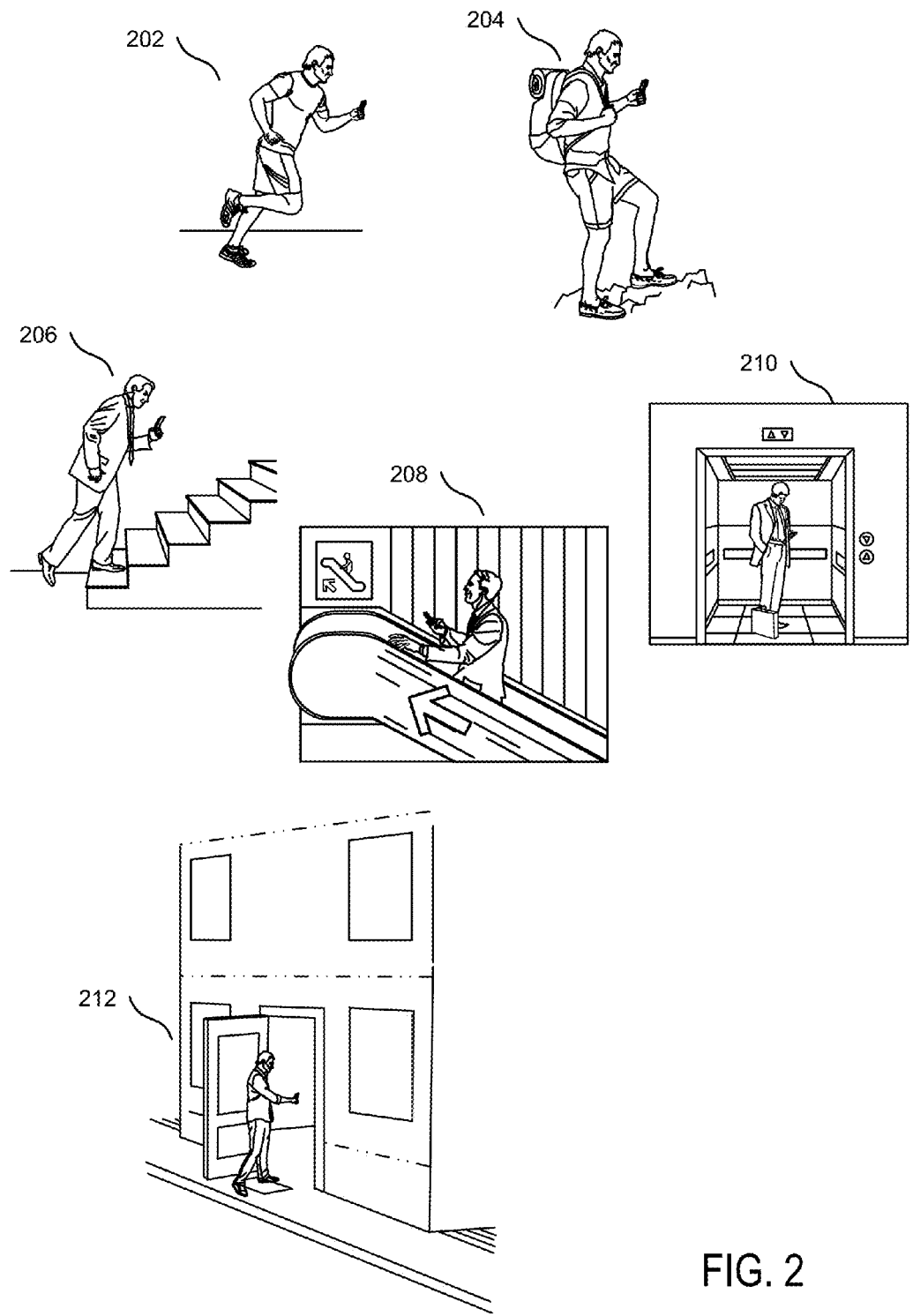
FIG. 2 illustrates various examples of a mobile device utilizing pressure data, according to some embodiments.

Referring to FIG. 2, various examples that may utilize barometric readings or other pressure-related measurements are illustrated. For example, referring to illustrations 202 and 204, barometric readings obtained by a mobile device, such as computing device 100, carried by a jogger or hiker may monitor the change in altitude along the jogger or hiker's path. In another example, referring to illustrations 206, 208, and 210, a user carrying device 100 may distinguish between whether the user is climbing stairs, taking an escalator, or taking an elevator, based on a detecting a pattern of change in pressure over a period of time. For example, a user climbing stairs may exhibit a pattern of a change in pressure that rises quickly, then remains constant for a brief period, then rises quickly again, and so forth, consistent with the motion of a user climbing stairs. As another example, a person taking an escalator may exhibit a pattern of a change in pressure that rises very steadily and at a constant rate. Furthermore, a person taking an elevator may exhibit a pattern of change in pressure consistent with having a door close, then having elevation change at an accelerating then decelerating rate, consistent with how an elevator moves. As yet another example, referring to illustration 212, computing device 100 may detect when a person is opening a door to a building by detecting a sudden change in pressure consistent with usual patterns for opening a door separating an inside of the building from outside ambient pressure.

Other example applications utilizing barometric readings include determining what floor a user carrying computing device 100 is on, which may require only periodic but still constant pressure-reading measurements. As another example, pressure readings may be provided as training data to test or determine which floor the computing device 100 is on. The training data may be provided by multiple users each equipped with, for example computing device 100, using crowdsourcing methods, for example. In general, numerous applications may utilize pressure readings obtained on various devices, and embodiments are not so limited.

Sampling barometer or other pressure sensor readings on a device can be considerably costly, at least in terms of power consumption. In all of the aforementioned examples, barometer readings must be acquired frequently and over a sustained period of time in order to achieve their desired functions. This frequent and prolonged sampling can consume a large amount of energy, and in certain devices, such as mobile devices, such constant sampling may be particularly detrimental to the overall use of the mobile device (e.g., reduced battery life, reduced performance, or the like). In some cases, conventional remedies have been to activate or turn on the pressure sensor or application utilizing the pressure data on an as-needed basis. However, this tactic may cause time delays, as it may take a period of time to activate the pressure sensor, and may also take more time for the pressure sensor to obtain an accurate initial reading. Using this tactic may be disadvantageous for certain applications. For example, since it may be unpredictable when a user of a mobile or computing device changes floors, an application may need to continuously sample the barometer or pressure sensor to prepare for any event if and/or when the user change floors. It may desirable therefore to obtain such pressure readings in a device in a more energy and time-efficient manner.

The present disclosures solve these and other problems. In some embodiments, a device such as computing device 100 includes a processor or processor core configured to execute applications, programs, or other various software typically run on one or more operating systems, and another processor or processor core configured to access pressure sensor data from a pressure sensor and not execute these applications or programs. The processor core configured to access the pressure sensor data may be referred to herein as a "sensor core," and may be a low power core that consumes far less power than the processor core configured to execute applications, referred to herein as an "application processor" or "application core." In some embodiments, for example, the sensor core requires ten times less power than the application processor, and continuously samples pressure sensor data from a pressure sensor, such as a barometer. In some embodiments, the sensor core and the application processor are coupled in particular configurations to allow the application processor to utilize the pressure sensor data in an energy and time-efficient manner. Some examples will be described more below.

Figure 3:
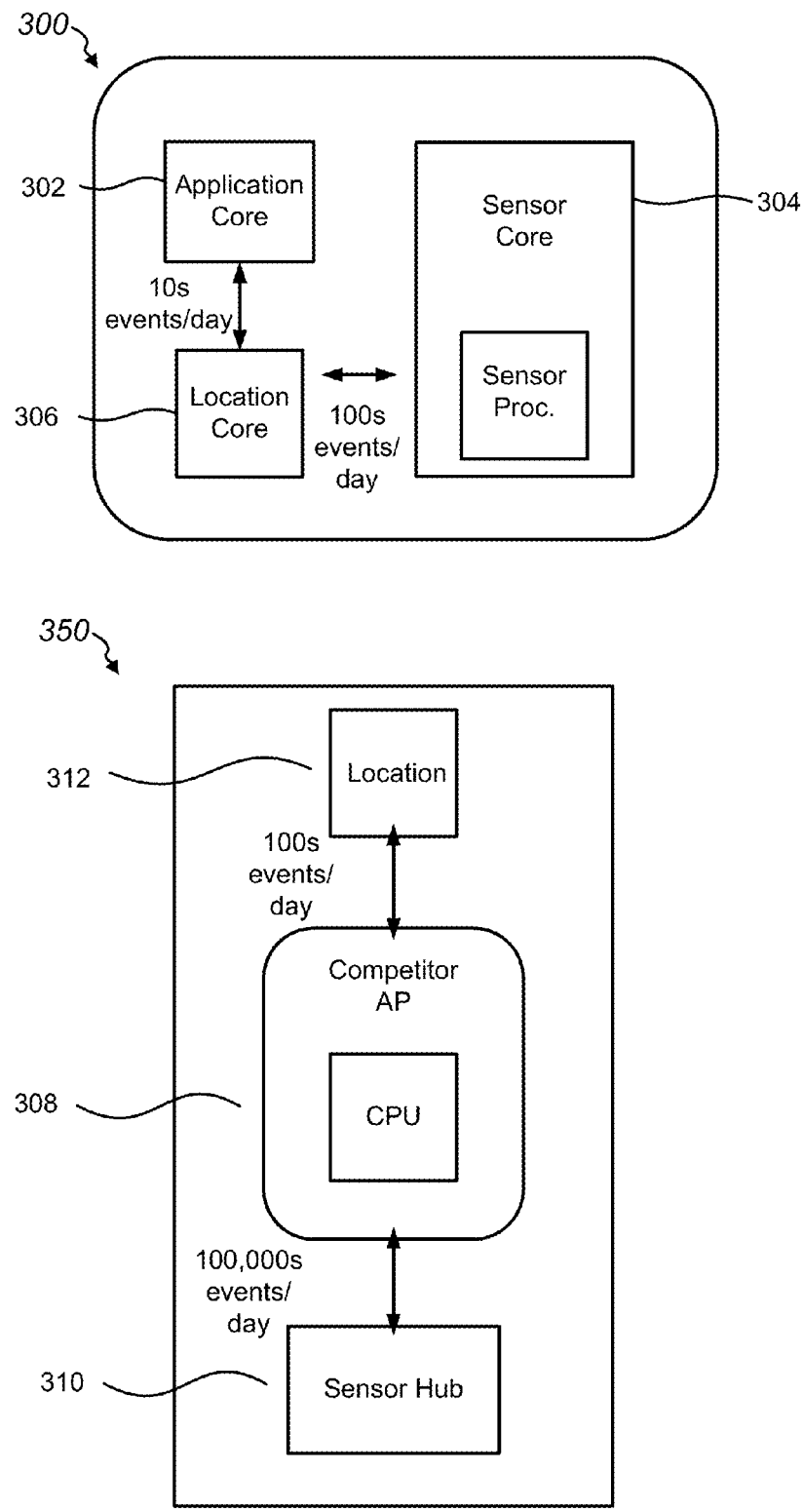
FIG. 3 illustrates an example schematic of a processor according to some embodiments, as well as an example processor currently in the industry.

Referring to FIG. 3, in some embodiments, an example processor 300 illustrates an example high-level design architecture utilizing an application core and sensor core as previously mentioned. The processor 300 may be included within a mobile device. The application core 302 may be a conventional processor or central processing unit (CPU) that is configured to run applications. The sensor core 304 is a low-power unit, and may consume 10× less power than the application core 302. The sensor core 304 is configured to obtain pressure-sensor data from a pressure sensor (not shown). In some embodiments, the pressure sensor is also included in the same apparatus as the example processor 300. Because of this configuration, the application core 302 can operate as it normally would, utilizing the necessary power to run applications, while the sensor core 304 is optimized in an energy-efficient manner to perform tasks related to obtaining pressure sensor data. For example, here, the application core 302 and sensor core 304 may be coupled to a third core called a location core 306, which may be optimally configured to facilitate location techniques. The application core 302 may need to communicate with the location core 306 on the order of tens of events per day, while the sensor core 304 may communicate with the location core 306 on the order of hundreds of events per day. If the functionality in the sensor core 304 were performed by the application core 302, then the application core 302 would inefficiently need to sample the location core 306 on the order of hundreds of events per day, resulting in highly inefficient energy consumption. In some embodiments, the application core 302 may communicate directly with the sensor core 304 (not shown).

FIG. 3 also illustrates a conventional processor 350. This illustration contrasts how power-inefficient conventional processor designs may be when trying to incorporate pressure-sensor capabilities. In this example, the sensor hub 310 represents the source where the pressure sensor data may be obtained, which contrasts to the sensor core 304 in processor 300 according to some embodiments. However, in conventional processor 350, the conventional CPU 308 may need to access the sensor hub 310 on the order of hundreds of thousands of times a day, using a standard amount of power consumption for a conventional CPU for every sampling. Additionally, a location processor or application 312 may be communicatively coupled to CPU 308, but may not be directly connected to the sensor hub 310. In the event that the location processor or application 312 needs to access pressure sensor data, the CPU 308 would first need to access the sensor hub 310, and then contact the location processor or application 312. Such a configuration is sub-optimal.

The application core 302 may be configured to perform floor disambiguation techniques. Floor disambiguation techniques may be implemented by a processor using one or more of an algorithm, a program, an application, and/or the like. For example, the application core 302 may perform floor disambiguation techniques in response to pressure sensor readings (e.g., rate of change of pressure, amount of pressure change, or the like) and/or in response to one or more interrupts. As noted above, a floor disambiguation technique may refer to a program or application that determines a floor or altitude at which a mobile device is located. The floor disambiguation technique may use the determined floor or altitude to retrieve a map or other reference information that corresponds to the determined floor or altitude. For example, the application core 302 may be prompted to launch one or more applications, such as a floor determination or disambiguation algorithm. In some embodiments, the map or other reference information of the floor or other location corresponding to the determined altitude may then be displayed on the mobile device.

In one example, a mobile device (e.g., the sensor core 304) may determine that the mobile device is undergoing an altitude change by determining that a detected rate-of-pressure-change has exceeded a rate-of-pressure-change threshold that corresponds to weather related pressure. Once it is determined that the mobile device has undergone a pressure change at a rate exceeding that of weather change, the mobile device may determine whether the change in pressure exceeds a predetermined pressure-change threshold. The predetermined pressure-change threshold may correspond to a minimum pressure change that corresponds to moving up or down at least one floor or other altitude change. Once the pressure change is detected to exceed the pressure-change threshold, the mobile device may perform a floor disambiguation technique. Further details relating to determining a rate of change of pressure and an amount of change in pressure will be described in more detail below.

In some embodiments, floor disambiguation techniques may determine a floor or altitude of a mobile device based on data from a pressure sensor, such as a barometer or altimeter. For example, a barometer of a mobile device may determine a pressure change of the mobile device. In some embodiments, the barometer or other components used to detect pressure data may be calibrated to filter out weather related pressure. For example, pressure attributable to weather at sea level may be 29-31 inches of mercury. The barometer may be calibrated to disregard from a detected pressure reading the pressure attributable to weather. In some embodiments, a low pass filter or high pass filter may be used to filter out certain levels of pressure below a threshold level. In one example, the mobile device may determine that a floor disambiguation technique is to be performed based on the current change in pressure and/or rate of change of pressure detected by the altimeter (as calibrated for weather related pressure) being above certain thresholds. The mobile device (e.g., the application core 302) may be aware of an amount of pressure change per floor. The mobile device (e.g., the application core 302) may then divide a total determined pressure change (as detected by the barometer) by the amount of pressure change per floor in order to determine the current floor on which the mobile device is located.

In some embodiments, floor disambiguation techniques may determine a floor or altitude of a mobile device based on data from one or more wireless terrestrial transceivers (e.g., an access point). For example, a mobile device may receive signals (e.g., based on a radio frequency (RF) signal scan, or the like) from one or more wireless terrestrial transceivers using one or more communications protocols, such as WiFi or any other suitable wireless communication protocol. In one example, a building may include five floors, with each floor including a number of access points. The mobile device may be located on the third floor and may detect the strongest signals from wireless terrestrial transceivers located on the third floor. Using these signals, the mobile device may determine that the signals correspond to wireless terrestrial transceivers that are located on the third floor, and thus that the mobile device is located on the third floor. For example, a received signal strength (RSSI) or round-trip time (RTT) of a wireless terrestrial transceiver signal may be determined by the mobile device. The mobile device may then use the RSSI or RTT to determine the location of the mobile device relative to the wireless terrestrial transceiver. In some embodiments, the mobile device may send the received wireless terrestrial transceivers signals to a server (e.g., a location server), and the server may return a response to the mobile device indicating that the wireless terrestrial transceivers are located on the third floor.

In some embodiments, both an altimeter and one or more wireless terrestrial transceiver signals may be used to determine and/or verify a floor or altitude determination. In one example, an altimeter reading may be used to verify a floor determination based on one or more wireless terrestrial transceiver signals. In another example, in the event an altimeter reading indicates a pressure that could correspond to a third or fourth floor, for example, signal readings from terrestrial wireless transceivers on the third and fourth floors may indicate that the signal strength of terrestrial wireless transceivers on the fourth floor are stronger than those on the third floor, and thus that the mobile device is located on the fourth floor. In yet another example, wireless terrestrial transceivers signals may be used to calibrate a barometer and/or altimeter.

One of ordinary skill in the art will understand that any combination of the floor disambiguation techniques described above may be used to implement any embodiments described herein.

Figure 4:
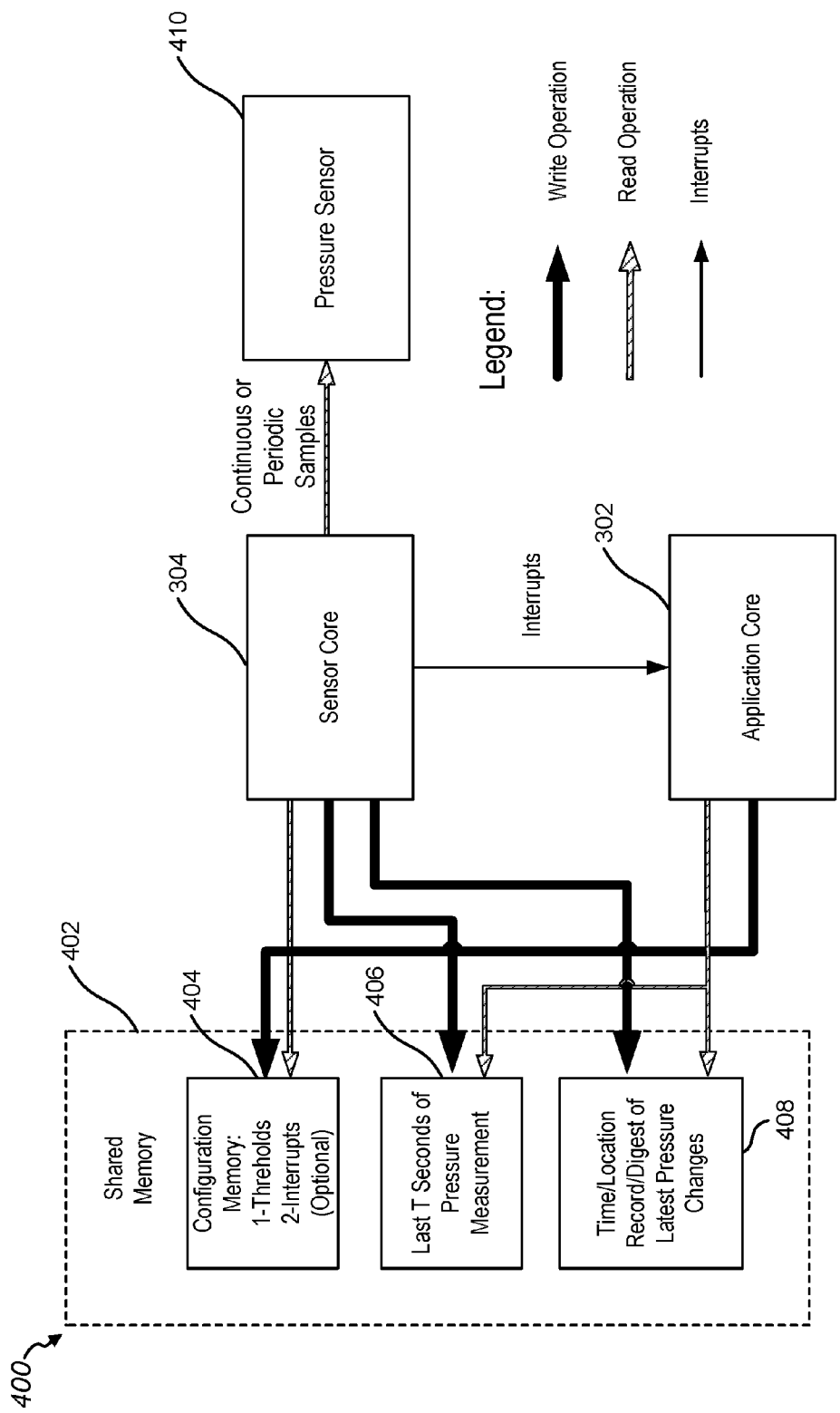
FIG. 4 illustrates an example functional block diagram of a mobile device subsystem according to some embodiments.

Referring to FIG. 4, additional functionality according to some embodiments is illustrated in functional diagram 400. In some embodiments, the sensor core 304 may be understood as more than just a simple processor performing minimal tasks in a power-efficient manner. Rather, in some embodiments, at least three general areas of functionality may also be performed by the sensor core 304 while it interacts with the application core 302. For example, in FIG. 4, a shared memory 402 is included in designs of some embodiments, which is communicatively coupled to the application core 302 and the sensor core 304. Three example processes are shown utilizing the shared memory 402.

First, in some embodiments, the sensor core 304 may be configured to interrupt the application core 302 when a triggering event occurs. In some embodiments, the triggering event may be based on data from the pressure sensor 410. Examples of a triggering event may include detecting that the pressure sampled from the pressure sensor 410 has changed more than a threshold. For example, the threshold may be set to a certain pressure differential that suggests a user carrying a mobile device with the processor in FIG. 4 has changed floors (e.g., 4 Pascal, 10 Pascal, 25 Pascal, 50 Pascal, or the like). In some embodiments, the pressure sampled from the pressure sensor 410 may be continuously or constantly sampled. In some embodiments, the pressure may be periodically sampled from the pressure sensor 410 (e.g., every 1 second, 2 seconds, 5 seconds, or the like). In some embodiments, the triggering event may then prompt the application core 302 to perform a floor disambiguation technique, such as one or more of those described above. The interrupt mechanism may allow a processor running applications that typically require constant monitoring of pressure changes to operate the applications while only minimally accessing pressure data. Accordingly, by separating the functionality of pressure data monitoring from applications utilizing such monitored pressure data (e.g., to the low-power core and the conventional application core, respectively), highly efficient energy consumption can be achieved. In some embodiments, floor disambiguation may be performed directly without using an interrupt condition, as described in more detail below.

In some embodiments, the application core 302 may be configured to write in the shared memory 402 threshold conditions contained in configuration memory 404. The threshold conditions may indicate when to perform a floor disambiguation technique and/or when to perform an interrupt. For example, a threshold condition may indicate that an interrupt is to be performed when the pressure change occurs that is equivalent to at least 10 feet difference in elevation (or other change in pressure associated with other floor heights, depending on the type of building and/or as local standards dictate) over a 3 minute span. In some embodiments, multiple threshold conditions may be written into the shared memory 402. For example, a second threshold condition may provide a triggering event that triggers an interrupt when the pressure suddenly changes above a threshold in a 1 second span, suggesting the user of the mobile device has entered a building from the outside (e.g., due to the sudden nature of the pressure change). The user through the application core 302 may set the thresholds manually, or the application core 302 may receive metadata or assistance data to properly configure certain thresholds. For example, the application core 302 may receive, from a server for example, data specifications relating to an indoor space, such as a height of each floor, and then may set the thresholds for floor change detection based on the received data. Similarly, the sensor core 304 may be configured to provide more than one type of interrupt, based on what type of threshold condition is detected. The sensor core 304 may be configured to read the condition(s) 404 provided in shared memory 402, determine when the condition(s) occur(s), determine what type of interrupt is appropriate based on what is specified, and then interrupt the application core when the condition(s) occur(s). In some embodiments, the sensor core 304 may be configured to have only read access to the configuration memory 404 containing the thresholds and interrupts, and the application core 302 may be configured to have only write access to the configuration memory 404. In general, the legend in FIG. 4 illustrates the type of operation that can flow from one functional block to another, according to some embodiments.

In some embodiments, as a second type of functionality, the sensor core 304 may be configured to write to a buffer 406 (e.g., such as a circular buffer, a FIFO buffer, or the like) in the shared memory 402 to continuously record the latest or most recent pressure measurements, e.g., the last 20 seconds of pressure measurements. The application core 302 may then read the latest pressure measurements at a time of its choosing, e.g., if an application only periodically requires the latest pressure data. For example, after receiving the pressure measurements or an interrupt from the sensor core 304, the application core 302 may activate a floor determination or disambiguation technique. The application core 302 may then access the buffer 406 and analyze the most recent pressure data to determine whether the mobile device has actually changed floors.

In one example, the application core 302 may operate a rolling altitude application for a biker, which can plot in real time the change in height as the biker rides up and down hills, bridges, overpasses, etc. In some embodiments, the sensor core 304 may also compute a rolling average of the latest pressure measurements, and/or compute and record a change in the latest pressure measurements using a low pass filter, for example. If a change in pressure is detected, then these events could be recorded in the shared memory 402 by the sensor core 304 and be readily available for the application core 302 to read. In some embodiments, use of a rolling average of the latest pressure measurements may be useful to smooth out subtle but constant perturbations, such as a truck driving on a bumpy road, or jogging motions, assuming a pressure sensor 410 is capable of detecting such minute changes. In some embodiments, raw pressure measurements may be stored over time. Similarly, a rate of change of the pressure measurements over a specified period of time could be written into the buffer 406 or other related memory. The rate of change data could be utilized by the application core 302 for various applications. For example, an application could determine a rate of decent of a vehicle, such as a grade, and provide warnings or messages as to a proper speed.

In some embodiments, as a third type of functionality, the sensor core 304 may be configured to record notable pressure change events, such as those mentioned above, in a digest 408 in the shared memory 402. A time stamp and other relevant data may be recorded at the same time. The application core 302 may be configured to access the shared memory 402 to look for these events, and may use the events in any applications. In some embodiments, a "time-to-live" (TTL) validity period may be applied to each of these events. The TTL validity period may indicate how long the recorded events are reliable. For example, as pressure readings change from day to day even at the same elevation, pressure readings from a previous day may be inaccurate and not useful for the next day. When the TTL validity period expires, the sensor core 304 may be configured to erase or disregard and/or discard those entries. In some embodiments, the digest may also contain location information (e.g., a map or other location information), recorded in various forms known in the art. The application core 302 may be configured to utilize the information in the digest 408 in various ways. For example, after receiving an interrupt, the application core 302 may access the digest to read an event that may have occurred, an exact time or a period of time at which the event occurred, a location where the event occurred, a magnitude (e.g. how large the change in pressure) of the event, and/or the like.

Some or all of the described functions may be available to various embodiments. In some embodiments, the sensor core and application core may read/write to a shared memory in a separate device, such as a server, accessed via wireless or wired means known in the art. In some embodiments, other processors or sensors may be configured to communicate with the sensor core 304 and/or application core 302, such as a location processor, gyroscope, compass, etc. Embodiments are not so limited.

Figure 5A:
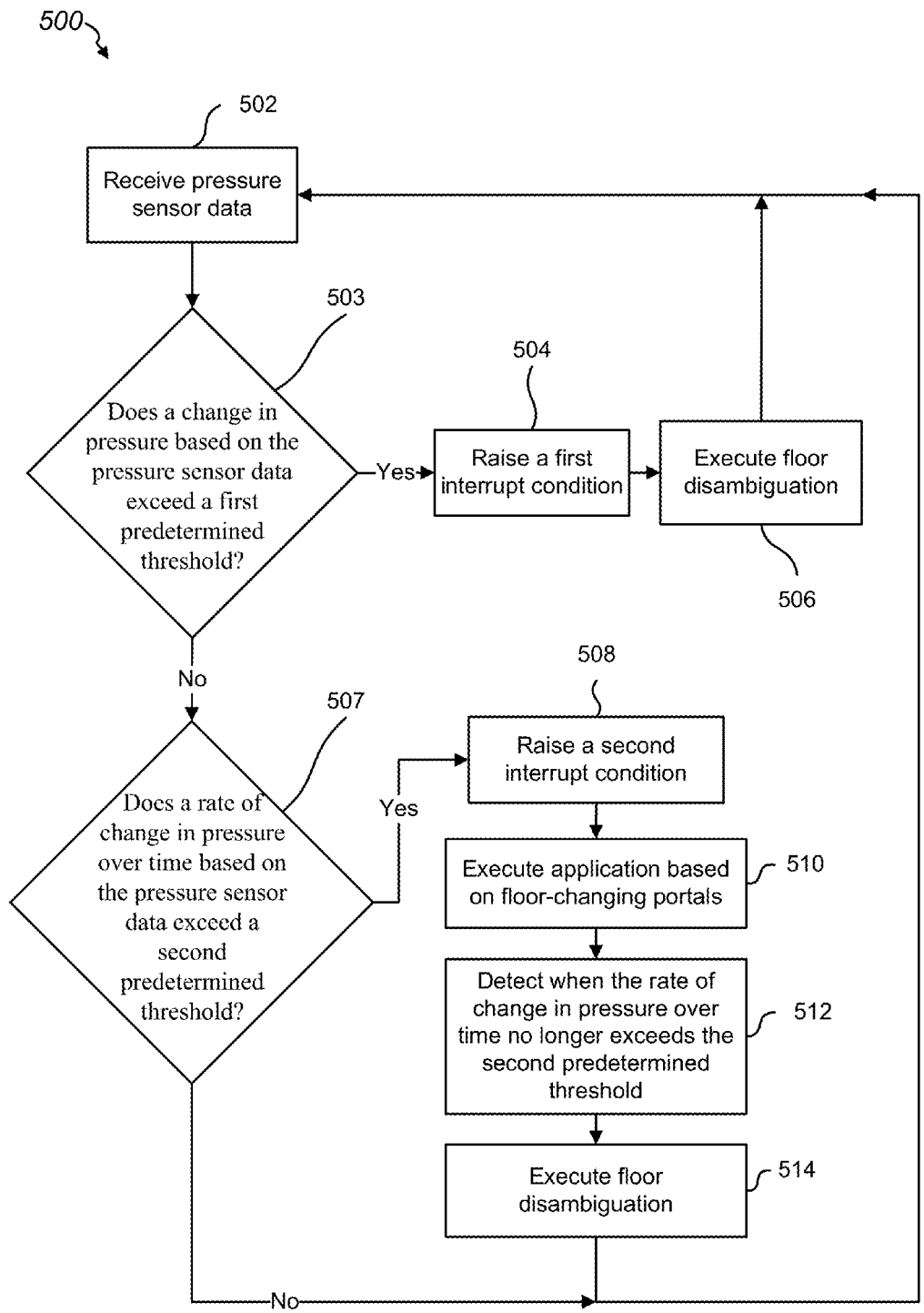
FIG. 5A illustrates an example flowchart illustrating a method according to some embodiments.

Referring to FIG. 5A, method 500 illustrates an example series of method steps for detecting altitude or floor changes utilizing pressure sensor data. The methods described herein may be implemented by various means, including the example apparatuses (e.g., a mobile device), systems, and/or processors executing code described in any of FIGS. 1, 2, 3, 4, and/or 7. It is also realized that, while the methods 500 and 550 of FIGS. 5A and 5B are illustrated as using interrupts, both embodiments may be implemented without the use of interrupts. For example, in some embodiments, the methods 500 and 550 may be implemented without the interrupt steps 504, 508, and 516, proceeding directly to the next element (e.g., 506, 510 and 518, respectively), such as through a procedure call and/or through a multi-tasking and/or multi-threaded procedure. At block 502, a method may include receiving pressure sensor data. For example, the method may include receiving first pressure sensor data. The pressure sensor data may be derived from measurements from a pressure sensor, such as a barometer, altimeter, or other similar devices known in the industry. In some embodiments, the pressure sensor data may be derived from a pressure sensor 410, such as barometer sensor, which may be built into a device, such as computing device 100.

At decision block 503, it may be determined whether a change in pressure based on the pressure sensor data exceeds a first predetermined threshold. The first predetermined threshold may be referred to as a "pressure-change threshold." For example, the method may determine that a change in pressure of the first pressure sensor data exceeds a first predetermined threshold. In some embodiments, the method may determine from the pressure sensor data that the pressure has changed equivalent to ten feet in altitude. As used herein, the term "exceed" may in some cases refer to a quantity rising above or surpassing some predetermined threshold. In other cases, the term "exceed" may refer to a quantity equaling or surpassing some predetermined threshold. Embodiments described herein are not so limited to either case.

At block 504, the method may raise a first interrupt condition. For example, the method may raise the first interrupt condition in the event the method determines that the change in pressure has exceeded the first predetermined threshold. The first interrupt condition may be optional in some embodiments.

At block 506, the method may perform or execute floor disambiguation or determination. For example, the method, using a processor, may execute a floor disambiguation or determination algorithm, program, or application in response to the first interrupt condition. In some embodiments, the first interrupt condition may signal to the application core 302 that the computing device 100 has changed elevation beyond some predetermined threshold. In response, an application for determining whether computing device 100 has changed floors, e.g. a floor disambiguation algorithm, may be executed by the application core 302. The method may then continue receiving pressure sensor data for monitoring. In some embodiments, the first interrupt condition may not be raised. In such embodiments, the floor disambiguation or determination may be performed directly without an interrupt. For example, the floor disambiguation or determination may be performed in response to determining that the change in pressure of the first pressure sensor data exceeds the first predetermined threshold.

If it is determined at block 503 that a change in pressure does not exceed the first predetermined threshold, then methods may proceed to block 507, where methods may also include determining if a rate of change in pressure over time based on the pressure sensor data exceeds a second predetermined threshold. For example, the method may receive second pressure sensor data at block 502, may determine that a change in pressure of the second pressure sensor data does not exceed the first predetermined threshold at block 503, and may determine at block 507 that a rate of change in pressure over time of the second pressure sensor data exceeds the second predetermined threshold. Of note, the decision in block 507 is based not on a difference in pressure between one point and the next (e.g., as in block 503), but rather may be based on the rate of change in pressure over time. For example, over a period of 3 seconds, the sensor core 304 may determine that the computing device 100 has steadily changed pressure at a change in altitude rate equivalent to one foot per second. The second predetermined threshold may be used to disregard rates of changes in pressure that relate to weather changes, as described above. For example, the second predetermined threshold may be set to a level (e.g., 29 inches of mercury, 30 inches of mercury, 31 inches of mercury, or the like) that corresponds to a rate of weather related pressure change. Any rate of change in pressure that is below (or optionally equal to or below) may be disregarded. The second predetermined threshold may be referred to as a "predetermined rate-of-pressure-change threshold." The method may proceed back to block 502 in the event it is determined that a rate of change in pressure over time does not exceed a second predetermined threshold, where pressure sensor data may be continually or periodically received.

At block 508, the method may raise a second interrupt condition. For example, the method may raise the second interrupt condition if the method determines at block 507 that the rate of change in pressure over time exceeds the second predetermined threshold (e.g., based, at least in part, on the second pressure sensor data).

At block 510, the method may determine by what method or means a user of the mobile device is changing floors or altitude. For example, the method, using a processor, may execute an application, algorithm, or program based on floor-changing portals in response to the second interrupt condition. As one example, the application core 302 may be notified of the second interrupt condition, and may know that the second interrupt condition corresponds to a rate of change over time in the pressure measurements, or in other words, a steady change in elevation. In some embodiments, the second interrupt condition may not be raised. In such embodiments, the application, algorithm, or program based on floor-changing portals may be executed directly in response to the rate of change in pressure over time exceeding the second predetermined threshold.

In response, the application core 302 may determine (e.g., by running an application) the means by which the user of the mobile device is rising or falling in elevation. The application core 302 may be able to distinguish if, for example, the user is walking up or down a flight of stairs, going up or down in an elevator, or going up or down an escalator. The application core 302 may distinguish between these three modes by analyzing the patterns in the rates of change in the pressure data over time. For example, the application core 302 may determine that the user is walking up or down the stairs if the change in pressure data rises or falls at a somewhat uneven pace, which corresponds to the user taking each step versus the slight pauses between each step. In another example, the application core 302 may determine that the user is going up or down an escalator if the change in pressure data rises or falls at a steady, constant rate, corresponding to the constant rotation of the escalator steps. As a further example, the application core 302 may determine that the user of the mobile device is going up in an elevator if the change in pressure over time increases slightly and then reaches a steady rate, corresponding to how an elevator may initially accelerate before reaching a constant velocity. One of ordinary skill in the art will appreciate that these are merely examples of how an application based on floor-changing portals may operate, and are not limiting. Other methods and algorithms readily apparent to those skilled in the art are within the scope of the present disclosures and embodiments are not so limited.

At block 512, in some embodiments, the method may also include detecting when the rate of change in pressure over time no longer exceeds the second predetermined threshold. For example, the method may detect when the rate in change in pressure over time reaches zero. As the pressure may no longer be changing or changing by a small amount, the determination may indicate that the mobile device is no longer changing in altitude or elevation, which may suggest that a user of the mobile device has now reached another floor. For example, the sensor core 304 may observe that the pressure data has now reached a steady pressure. As another example, the application core 302 may execute an application that has made the same determination.

At block 514, the method may perform or execute floor disambiguation or determination. For example, the method, using a processor, may execute a floor disambiguation or determination technique, such as those described above, in response to detecting that the rate of change in pressure over time no longer exceeds the second predetermined threshold (e.g., is zero). In some embodiments, the floor disambiguation algorithm may be the same algorithm as described in block 506. This algorithm may be executed in order to verify whether the mobile device has in fact changed floors and, if so, determine the new floor. Methods may then proceed back to block 502, where pressure sensor data may be continually or periodically received in order to detect the next change in pressure, if any.

Referring to FIG. 5B, flowchart illustrates a method 550 including a series of method steps according to some embodiments. Here, first and second interrupt conditions may be raised, similar to those described in FIG. 5A, with similar responses. However, at block 507, if it is determined that the rate of change in pressure over time does not exceed a second predetermined threshold, then the method may proceed to block 515. Here, the method may determine whether a rate of change of the rate of change in pressure over time (i.e. the second derivative), based on the pressure sensor data, is detected to exceed a third predetermined threshold. For example, the method may determine that a rate of change of the rate of change in pressure over time (based on the second pressure sensor data described above) exceeds the third predetermined threshold. In some embodiments, determining the first derivative or second derivative with respect to time may be implemented by first low pass filtering the signal. Of note, the third interrupt condition described herein may be based on the change in the rate of change over time of the pressure, or in other words, a measure of an acceleration of the pressure. In some embodiments, detection of a sudden or quick change in pressure—corresponding to a large change in the rate of change in pressure over time—may be consistent with a user opening a door that separates indoors from outdoors, for example. The method may proceed back to block 502 in the event it is determined that the rate of change of the rate of change in pressure over time does not exceed the third predetermined threshold, where pressure sensor data may be continually or periodically received for detecting the next change in pressure, if any.

At block 516, the method may raise a third interrupt condition. For example, the method may raise the third interrupt condition if it is determined that a rate of change of the rate of change in pressure over time exceeds the third predetermined threshold. In some embodiments, the mobile device may determine a velocity of the mobile device (e.g., using a velocity sensor, accelerometer sensor, or the like), and may raise the third interrupt condition based on the determined velocity.

At block 518, the method may switch between indoor navigation and outdoor navigation, based, at least in part, on the third interrupt condition, the rate of change of the rate of change in pressure, and/or the velocity. For example, in response to raising the third interrupt condition, a switch of applications may be made between executing an indoor navigation application and executing an outdoor navigation application, depending on where the user started before the sudden change in pressure was detected. For example, the application core 302 may initially be running an indoor navigation application. Then, upon receipt of the third interrupt condition indicating a sudden change in pressure, the application core 302 may switch from running the indoor navigation application to running an outdoor navigation application. The switch may be based on the reasoning that the sudden change in pressure corresponds to exiting the indoor environment and entering the outdoor environment. One of ordinary skill in the art will appreciate that the applications may be switched in the opposite order, provided the user was detected to be initially outdoors.

Figure 6:
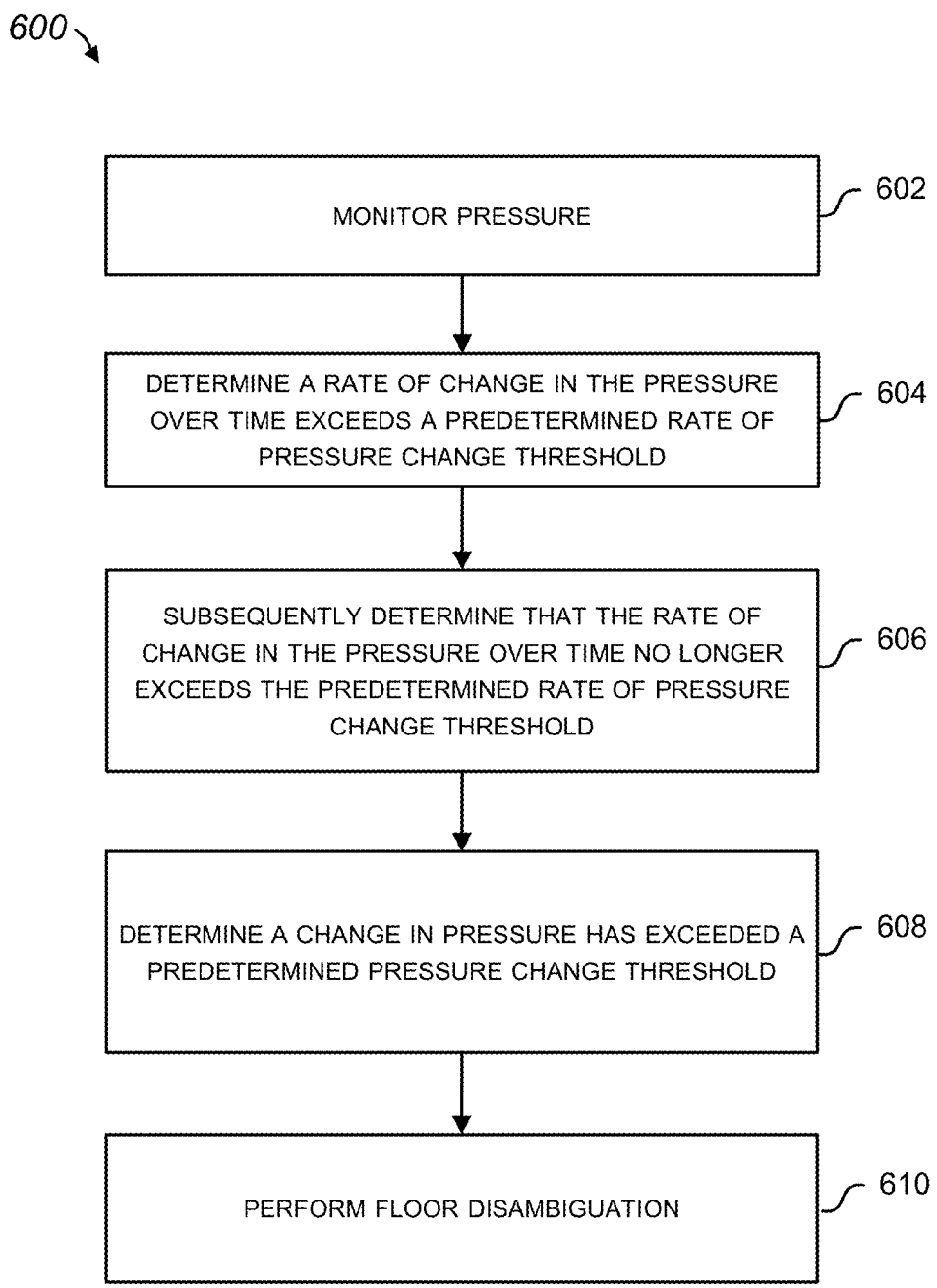
FIG. 6 illustrates an example flowchart illustrating a method according to some embodiments.

FIG. 6 illustrates a method 600 for detecting altitude or floor changes utilizing pressure sensor data. The method 600 may be implemented by various means, including the example apparatuses (e.g., a mobile device), systems, and/or processors executing code described in any of FIGS. 1, 2, 3, 4, and/or 7. At block 602, the method 600 may include monitoring pressure. For example, pressure experienced by a mobile device may be detected and/or measured using a pressure sensor in the mobile device (e.g., pressure sensor 410). The pressure sensor may comprise a barometer, an altimeter, or the like that is able to monitor air pressure. In some embodiments, the sensor core 304 described above may monitor the pressure.

At block 604, the method 600 may include determining a rate of change in the pressure exceeds a predetermined rate-of-pressure-change threshold. For example, the rate of change in the pressure may be determined using the sensor core 304 described above. The rate of change in pressure may be measured in pascals/second, inches of mercury/second, millimeters of mercury/second, or any other pressure-related measurement units. The predetermined rate-of-pressure-change threshold may correspond to and/or be selected to exceed rate-of-pressure change that may be attributed to weather-related pressure changes. For example, in an embodiment, the predetermined rate-of-pressure-change threshold may be set to determine whether a mobile device has undergone a pressure change at a rate exceeding that which may be accounted for by weather change. In an embodiment, the predetermined rate-of-pressure-change threshold may be set to a reasonable margin below an average rate-of-pressure change due to traversing stairs, riding escalators, and/or riding elevators so as to trigger pressure monitoring to determine when a mobile device is traversing stairs, riding escalators, and/or riding elevators, and to also determine when such traversal has stopped.

At block 606, the method 600 may include subsequently determining that the rate of change in the pressure over time no longer exceeds the predetermined rate-of-pressure-change threshold. For example, the sensor core 304 may determine the rate of change in the pressure over time no longer exceeds the predetermined rate-of-pressure-change threshold. By determining that the rate of change in the pressure over time no longer exceeds the predetermined rate-of-pressure-change threshold, the mobile device may determine that it is no longer changing in altitude or elevation. This may suggest that a user of the mobile device has reached a desired floor or other altitude. Determining that the rate of change in the pressure over time no longer exceeds the rate-of-pressure-change threshold allows further processing (e.g., steps 608-610 below) to be performed only when it is likely that the user has come to the desired floor or other altitude.

At block 608, the method 600 may include determining a change in pressure has exceeded a predetermined pressure-change threshold. For example, the determination that the change in pressure has exceeded a predetermined pressure-change threshold may be in response to subsequently determining that the rate of change in the pressure over time no longer exceeds the predetermined rate-of pressure-change threshold. In some embodiments, the sensor core 304 may determine the change in pressure has exceeded the predetermined pressure-change threshold. In some embodiments, the predetermined pressure-change threshold may correspond to a minimum pressure change that corresponds to moving up or down at least one floor or other altitude change. For example, the predetermined pressure-change threshold may be set to 4 Pascal, 10 Pascal, 25 Pascal, 50 Pascal, or any other appropriate pressure level. For example, if the average change of pressure per meter is 10 Pascal per meter (more or less linear at moderate altitudes), and if you know that, in the United States, offices have average floor heights of 13 feet (3.96 m), apartments have average floor heights of around 10 feet (3.05 m) and biotech labs have average floor heights of about 15 feet (4.57 m), you could determine, in a given area or even for a specific building what an average floor height should be, and therefore what the average pressure change per floor would also be. In some embodiments, the device may record or have provided to it, actual floor heights, possibly associated with an indoor map. The indoor map may also be annotated for wireless transceivers and other devices that may provide indications of a particular floor. In some cases, the minimum pressure change that corresponds to moving up or down at least one floor may be specific to ceiling heights in a particular building. For example, the lobby of a particular multi-story building might have higher ceilings than the rest of the floors and ceiling heights may vary from building to building. In an embodiment, an average floor height may be used, particularly if the true ceiling heights are not known. For example, it may be assumed that all ceiling heights on any given floor of a building are 10 ft, on the average, or possibly more for a lobby floor of the building. Accordingly, in the above-mentioned embodiment, the minimum pressure change that corresponds to moving up or down at least one floor may be the pressure change that corresponds to moving up or down 10 feet.

At block 610, the method 600 may include performing floor disambiguation. For example, the floor disambiguation may be performed in response to determining the change in pressure has exceeded the predetermined pressure-change threshold. In some embodiments, floor disambiguation may be performed by the application core 302 or other general purpose processor. An application core or general purpose processor may consume more power per task than a more dedicated core or other lower power core, such as the sensor core 304. Therefore, power may be saved by monitoring sensors in a lower power sensor core and only activating an application core or other higher power core when necessary, which may include, in some embodiments, using the application core for overall floor disambiguation, or, in some embodiments, limiting the use of the application core for wireless signal-based floor disambiguation. In some embodiments, the sensor core 304 may be a sensor processor that operates at a lower power than the application core 302 or general purpose processor, and thus may use less power than the application core 302 or general purpose processor. Accordingly, the sensor core 304 saves power by keeping the pressure monitoring process in the sensor core rather than the application core 302 or general purpose processor.

As described above, in some embodiments, the floor disambiguation technique may determine a floor or altitude of a mobile device based on data from a pressure sensor, such as pressure sensor 410. For example, the pressure sensor in the mobile device may determine a total pressure change experienced by the mobile device and may provide the pressure change to the application core 302. In an embodiment, the total pressure change may be used in conjunction with a prior floor determination to determine a new floor determination, possibly in conjunction with prior knowledge of actual or estimated floor heights. In an embodiment, the absolute pressure may be used to determine the altitude and to determine the floor based upon the altitude, based upon prior knowledge of actual or estimated floor altitudes and/or actual or estimated floor heights. In an embodiment, floor determination may also be determined based upon detected wireless signals, such as based upon wireless signals present on any given floor, and/or based upon the wireless signal strength and/or round trip time to known transceivers and/or location determined based upon wireless signals. Further, an amount of pressure change per floor may be input into the application core 302. For example, a pressure change per floor may be 4 Pascal, 10 Pascal, 25 Pascal, 50 Pascal, or the like. In some embodiments, a user may program the application core 302 with a predetermined pressure change per floor. In some embodiments, the application core 302 may come preprogrammed with a general pressure change per floor.

The application core 302 may then divide the total pressure change by the amount of pressure change per floor in order to determine the current floor on which the mobile device is located. For example, if the total detected pressure change is 50 Pascal, and the pressure change per floor is 10 Pascal, the application core 302 may determine that the mobile device has moved up or down five floors, depending on whether the pressure change is positive or negative. Using this example, in the event the mobile device starts on the first floor and the detected pressure change is 50 Pascal, the application core 302 may determine that the mobile device is located on the fifth floor. Using the same example, if the user starts on a floor other than the first floor, the application core 302 may determine from the detected pressure change of 50 Pascal that the floor change is five floors, and thus that the mobile device is five floors higher or lower than the floor on which the mobile device started. Accordingly, the application core 302 can figure out what floor the mobile device is on by adding or subtracting five floors to the floor on which the mobile device started.

In the event the application core 302 is not aware of the floor on which the mobile device started (e.g., the mobile device is just turned on), the application core 302 may subtract a currently detected pressure from a reference pressure at ground level (e.g., provided by a weather pressure reference station), and then divide the result by the pressure change per floor in order to calculate the number of floors. In some cases, if the pressure change is negative, the application core 302 may subtract the number of floors from the floor on which the mobile device started, or base it off of a ground level reference pressure.

In the event the calculation produces a pressure value that does not directly correspond to a floor change, the application core 302 may round up or down. For example, if the total detected pressure change is 49 Pascal, and the pressure change per floor is 10 Pascal, the application core 302 may calculate the number 4.9. The application core 302 may then round up to determine that the mobile device has moved up or down five floors (e.g., the mobile device is located on the fifth floor). In some embodiments, the application core 302 may use wireless terrestrial transceiver signals to verify the correct floor, as described above.

In some embodiments, the pressure sensor and/or sensor core may be calibrated to filter out weather related pressure. For example, pressure attributable to weather at sea level may be, for example, 29-31 inches of mercury. The pressure sensor and/or sensor core may be calibrated to disregard from a detected pressure reading the pressure attributable to weather. In some embodiments, a low pass filter or high pass filter may be used to filter out changes in pressure that occur at a rate below some threshold rate. Accordingly, the low or high pass filter may filter out and/or separately determine weather-related pressure changes that occur at a slower rate than pressure changes attributable to changes in altitude.

In some embodiments, the floor disambiguation technique may determine a floor or altitude of a mobile device based on data from one or more wireless terrestrial transceivers, such as an access point, a femto cell, a node B, and/or the like. For example, the application core 302 may cause the mobile device to receive signals from one or more wireless terrestrial transceivers in response to performing a radio frequency (RF) signal scan. The signals may be received using one or more communications protocols, such as WiFi. The application core 302 may determine the strongest signals from the wireless terrestrial transceivers. Using these signals, the application core 302 may determine that the signals correspond to wireless terrestrial transceivers that are located on a particular floor, and thus that the mobile device is located on that floor. In some embodiments, the mobile device may send the received wireless terrestrial transceivers signals to a server (e.g., a location server), and the server may return a response to the mobile device indicating that the wireless terrestrial transceivers are located on the third floor. In an embodiment, floor disambiguation may also involve using a pressure sensor to determine what floor a device is on or, if floor determination has already been performed recently and/or while in the same structure, using a pressure sensor to determine that a device is still on the same floor as it was when a prior floor determination was performed. In an embodiment, floor disambiguation may include using both a pressure sensor and wireless signals to determine that the floor determination using both techniques are consistent with each other (predict the same floor) and/or to calibrate the floor associated with a pressure sensor reading if the sensor reading is inconsistent with the floor determined through wireless signal-based floor disambiguation.

In some embodiments, an altimeter and one or more wireless terrestrial transceiver signals may be used to check each other, for example, to determine and/or verify a floor or altitude determination. For example, the initial floor determination by an altimeter might be verified or disproved based upon the wireless signals received from one or more wireless terrestrial transceivers. In another example, in the event an altimeter reading indicates a pressure that could correspond to a third or fourth floor, for example, signal readings from terrestrial wireless transceivers on the third and fourth floors may indicate that the signal strength of terrestrial wireless transceivers on the fourth floor are stronger than those on the third floor, and thus that the mobile device is located on the fourth floor. In yet another example, an altimeter reading may be used to verify or disprove a floor determination based on one or more wireless terrestrial transceiver signals.

One of ordinary skill in the art will understand that any combination of the floor disambiguation techniques described above may be used to implement any embodiments described herein.

In some embodiments, additional functions or method steps may be incorporated to the methods described in FIGS. 5A, 5B, and 6. These additional functions may include any and all of the other example descriptions discussed in FIGS. 1, 2, 3, and 4, and embodiments are not so limited. In some embodiments, a time-to-live (TTL) tag or validity period may be used. For example, the method 600 may include receiving a time-to-live (TTL) validity period associated with the change in pressure, determining that the TTL validity period associated with the change in pressure has expired, and disregarding the rate of change in pressure and/or the change in pressure. Accordingly, all expired or out of date pressure readings may be disregarded. In some embodiments, if the rate of pressure change being above a threshold is noticed after the TTL has expired, an indoor navigation system may have already determined the current floor based upon other means. For example, in an embodiment, an application core or general purpose processor may determine the wireless signal strengths that are strongest and may compare them to a map of wireless transmitters on different floors in order to determine on which floor the strongest signals are emanating from and selecting that floor as the current floor.

As another example, a TTL validity period may be attached or appended to any of the interrupt conditions described in FIGS. 5A and 5B, such that when the TTL validity period of an interrupt condition expires, the interrupt condition may be disregarded. The TTL validity period may indicate a period of validity for a determined pressure change, such that executing an application based on the pressure change may no longer be necessary if the TTL validity period has expired. In other cases, an application or interrupt may be reset or re-launched after the TTL validity period expires. This functionality may represent the notion that it may be desirable to periodically check whether an application should be executed. For example, when a user enters an indoor venue, the application core 302 may enable an interrupt for the next ten minutes, the interrupt corresponding to performing a floor disambiguation algorithm, and re-launch the interrupt every ten minutes as long as the user stays in the venue. The TTL validity period in this case would be ten minutes, and thus an interrupt would be disregarded and then re-launched every ten minutes.

In some embodiments, the method 600 may further include determining the mobile device is located in an indoor venue, and performing floor disambiguation in response to determining that the mobile device is located in an indoor venue. For example, the floor disambiguation may be activated once inside a building. The indoor location may be determined by, for example, detecting weak or no satellite signals (e.g., global navigation satellite system (GNSS) signals) or by a pressure that corresponds to an altitude significantly above ground level. In some embodiments, the method 600 may include determining a velocity of the mobile device exceeds a velocity threshold (e.g., a velocity normally associated with a moving vehicle, for example, on an open street, rather than pedestrian motion), and disregarding the pressure if the velocity of the mobile device exceeds the velocity threshold, or determining that the mobile device is in a moving vehicle and is therefore likely at ground level. For example, the sensor core 304 may determine a velocity of the mobile device using GNSS doppler and/or location determination, automotive odometer readings or other automotive sensor output, accelerometer sensor, or the like. As another example, velocity may be provided by a satellite signal processor (e.g., a GNSS processor) or other source of satellite readings and calculations. The velocity threshold may indicate whether the mobile device is located indoors or outdoors. For example, the velocity threshold may be set at 5 mph, 10 mph, or the like, to differentiate between pedestrian movement and driving on an open street. If the mobile device is traveling at a speed greater than 5 mph, for example, it may be determined that the mobile device is outdoors (e.g., travelling in a vehicle). Similarly, if the mobile device location is outside of any structure or if the location traverses multiple buildings, the device may be assumed to be outside. Location may be determined by various means such as through the use of GNSS, WiFi, WAN or other signals or combination thereof.

As other examples, a fitness application may utilize the pressure sensor measurements to advise the user to adjust his or her routine or pace of exercise. For example, the application may monitor the elevation or rate of change in elevation, and compare it with accelerometer data or other quantifiable fitness metrics (e.g. heart rate, calorie burn, blood pressure, etc.). The application may then guide the user, e.g. through the use of interrupts, to slow down, stop, speed up, etc., based on one or more preselected fitness goals (e.g. cardiac workout, weight loss, strength training, etc.). As another example, portal detection, and identifying its type (escalator, elevator, etc), may be used in crowdsourcing of maps. For example, a mobile device that finds an escalator in a location that was unmarked as such on the map may send an update to a map server to update/correct it. The server may apply the information, once a sufficient number of confirmations from other mobile devices in the area have been received. The detection of the portals may result from utilizing pressure sensor data according to the methods presented herein.

Many embodiments may be made in accordance with specific requirements. For example, customized hardware might also be used, and/or particular elements might be implemented in hardware, software (including portable software, such as applets, etc.), or both. Further, connection to other computing devices such as network input/output devices may be employed.

Figure 7:
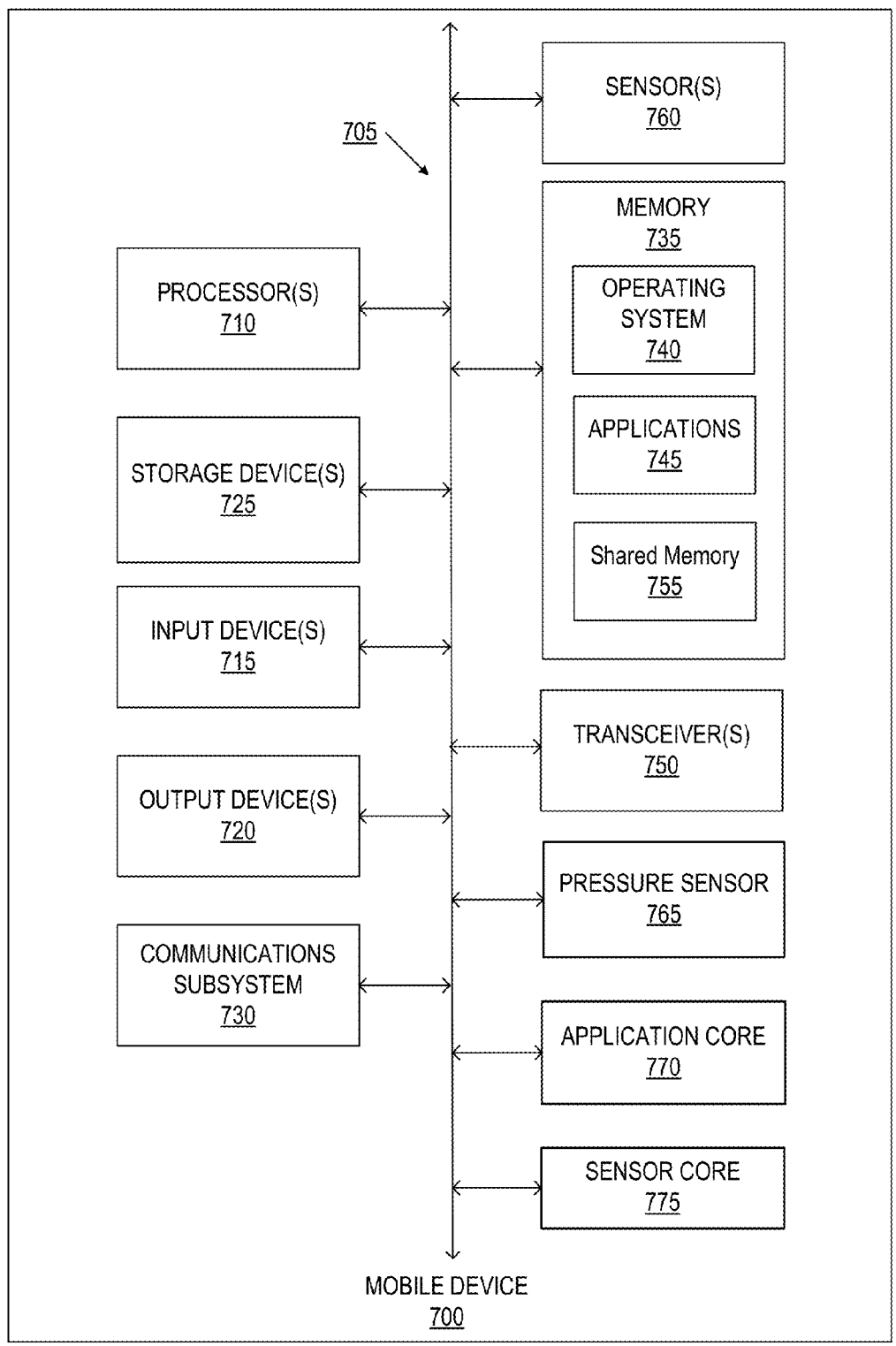
FIG. 7 is a block diagram of a mobile device according to some embodiments.

Having described multiple aspects of improving indoor positioning, an example of a mobile device in which various aspects of the disclosure may be implemented will now be described with respect to FIG. 7. According to one or more aspects, a mobile device as illustrated in FIG. 7 may implement, perform, and/or execute any and/or all of the features, methods, and/or method steps described herein. Examples of a mobile device include but are not limited to video game consoles, tablets, and smart phones, including example device 100. In some embodiments, the mobile device 700 is configured to implement any of the methods described above. FIG. 7 provides a schematic illustration of one embodiment of a mobile device 700 that can perform the methods provided by various other embodiments, as described herein, and/or can function as the host mobile device, a remote kiosk/terminal, a point-of-sale device, a mobile device, a set-top box, and/or a mobile device. FIG. 7 is meant only to provide a generalized illustration of various components, any and/or all of which may be utilized as appropriate. FIG. 7, therefore, broadly illustrates how individual system elements may be implemented in a relatively separated or relatively more integrated manner.

The mobile device 700 is shown comprising hardware elements that can be electrically coupled via a bus 705 (or may otherwise be in communication, as appropriate). The hardware elements may include one or more processors 710, including without limitation one or more general-purpose processors, application cores or processors, sensor cores or processors (such as those described in FIGS. 3, 4, 5A and 5B), and/or one or more special-purpose processors (such as digital signal processing chips, graphics acceleration processors, and/or the like); one or more input devices 715, which can include without limitation a camera, wireless receivers, wireless sensors, a mouse, a keyboard and/or the like; and one or more output devices 720, which can include without limitation a display unit, a printer and/or the like. In some embodiments, the one or more processors 710 may be configured to perform a subset or all of the functions described above with respect to FIGS. 5A and 5B. The one or more processors 710 may comprise a general processor, application processor or core, and sensor processor or core, for example. In some embodiments, the processor is integrated into an element that processes pressure data inputs and wireless sensor inputs.

The mobile device 700 may further include one or more sensor(s) 760 for receiving sensor data. Example sensors may include pressure sensor, such as a barometer or altimeter, an accelerometer, a gyrometer, a pedometer, and/or the like. The one or more sensor(s) 760 may be processed by the one or more processor(s) 710, and/or may be stored in memory 735.

The mobile device 700 may further include (and/or be in communication with) one or more non-transitory storage devices 725, which can comprise, without limitation, local and/or network accessible storage, and/or can include, without limitation, a disk drive, a drive array, an optical storage device, a solid-state storage device such as a random access memory ("RAM") and/or a read-only memory ("ROM"), which can be programmable, flash-updateable and/or the like. Such storage devices may be configured to implement any appropriate data storage, including without limitation, various file systems, database structures, and/or the like.

The mobile device 700 might also include a communications subsystem 730, which can include without limitation a modem, a network card (wireless or wired), an infrared communication device, a wireless communication device and/or chipset (such as a Bluetooth® device, an 802.11 device, a WiFi device, a WiMax device, cellular communication facilities, etc.), and/or the like. The communications subsystem 730 may permit data to be exchanged with a network (such as the network described below, to name one example), other mobile devices, and/or any other devices described herein. In many embodiments, the mobile device 700 will further comprise a non-transitory working memory 735, which can include a RAM or ROM device, as described above. In some embodiments, communications subsystem 730 may interface with transceiver(s) 750 configured to transmit and receive signals from access points or mobile devices. Some embodiments may include a separate receiver or receivers, and a separate transmitter or transmitters. The memory 735 may further comprise shared memory 755.

The mobile device 700 may further include pressure sensor 765, application core 770, and sensor core 775. The shared memory 755 may be communicatively coupled to the application core 302 and the sensor core 304 via bus 705. The shared memory 755, pressure sensor 765, application core 770, and sensor core 775 may operate according to the examples as described herein with respect to FIGS. 4, 5A, 5B, and/or 6.

The mobile device 700 also can comprise software elements, shown as being currently located within the working memory 735, including an operating system 740, device drivers, executable libraries, and/or other code, such as one or more application programs 745, which may comprise computer programs provided by various embodiments, and/or may be designed to implement methods, and/or configure systems, provided by other embodiments, as described herein. Merely by way of example, one or more procedures described with respect to the method(s) discussed above, for example as described with respect to FIGS. 5A, 5B, and/or 6, might be implemented as code and/or instructions executable by a computer (and/or a processor within a computer); in an aspect, then, such code and/or instructions can be used to configure and/or adapt a general purpose computer (or other device) to perform one or more operations in accordance with the described methods.

A set of these instructions and/or code might be stored on a processor-readable storage medium, such as the storage device(s) 725 described above. In some cases, the storage medium might be incorporated within a mobile device, such as mobile device 700. In other embodiments, the storage medium might be separate from a mobile device (e.g., a removable medium, such as a compact disc), and/or provided in an installation package, such that the storage medium can be used to program, configure and/or adapt a general purpose computer with the instructions/code stored thereon. These instructions might take the form of executable code, which is executable by the mobile device 700 and/or might take the form of source and/or installable code, which, upon compilation and/or installation on the mobile device 700 (e.g., using any of a variety of generally available compilers, installation programs, compression/decompression utilities, etc.) then takes the form of executable code.

Substantial variations may be made in accordance with specific requirements. For example, customized hardware might also be used, and/or particular elements might be implemented in hardware, software (including portable software, such as applets, etc.), or both. Further, connection to other computing devices such as network input/output devices may be employed.

Some embodiments may employ a mobile device (such as the mobile device 700) to perform methods in accordance with the disclosure. For example, some or all of the procedures of the described methods may be performed by the mobile device 700 in response to processor(s) 710 executing one or more sequences of one or more instructions (which might be incorporated into the operating system 740 and/or other code, such as an application program 745) contained in the working memory 735. Such instructions may be read into the working memory 735 from another processor-readable medium, such as one or more of the storage device(s) 725. Merely by way of example, execution of the sequences of instructions contained in the working memory 735 might cause the processor(s) 710 to perform one or more procedures of the methods described herein, for example methods described with respect to FIGS. 5A, 5B, and/or 6.

The terms "processor-readable medium," "machine-readable medium" and "computer-readable medium," as used herein, refer to any medium that participates in providing data that causes a machine to operate in a specific fashion. In an embodiment implemented using the mobile device 700, various processor-readable media might be involved in providing instructions/code to processor(s) 710 for execution and/or might be used to store and/or carry such instructions/code (e.g., as signals). In many implementations, a processor-readable medium is a physical and/or tangible storage medium. Such a medium may take many forms, including but not limited to, non-volatile media, volatile media, and transmission media. Non-volatile media include, for example, optical and/or magnetic disks, such as the storage device(s) 725. Volatile media include, without limitation, dynamic memory, such as the working memory 735. Transmission media include, without limitation, coaxial cables, copper wire and fiber optics, including the wires that comprise the bus 705, as well as the various components of the communications subsystem 730 (and/or the media by which the communications subsystem 730 provides communication with other devices). Hence, transmission media can also take the form of waves (including without limitation radio, acoustic and/or light waves, such as those generated during radio-wave and infrared data communications).

Common forms of physical and/or tangible processor-readable media include, for example, a floppy disk, a flexible disk, hard disk, magnetic tape, or any other magnetic medium, a CD-ROM, any other optical medium, punchcards, papertape, any other physical medium with patterns of holes, a RAM, a PROM, EPROM, a FLASH-EPROM, any other memory chip or cartridge, a carrier wave as described hereinafter, or any other medium from which a computer can read instructions and/or code.

Various forms of processor-readable media may be involved in carrying one or more sequences of one or more instructions to the processor(s) 710 for execution. Merely by way of example, the instructions may initially be carried on a magnetic disk and/or optical disc of a remote computer. A remote computer might load the instructions into its dynamic memory and send the instructions as signals over a transmission medium to be received and/or executed by the mobile device 700. These signals, which might be in the form of electromagnetic signals, acoustic signals, optical signals and/or the like, are all examples of carrier waves on which instructions can be encoded, in accordance with various embodiments of the invention.

The communications subsystem 730 (and/or components thereof) generally will receive the signals, and the bus 705 then might carry the signals (and/or the data, instructions, etc. carried by the signals) to the working memory 735, from which the processor(s) 710 retrieves and executes the instructions. The instructions received by the working memory 735 may optionally be stored on a non-transitory storage device 725 either before or after execution by the processor(s) 710. Memory 735 may contain at least one database according to any of the databases and methods described herein. Memory 735 may thus store any of the values discussed in any of the present disclosures, including FIGS. 1, 2, 3, 4, 5A, 5B, 6, and related descriptions.

The methods described in FIGS. 5A, 5B, and 6 may be implemented by various blocks in FIG. 7. For example, sensor(s) 760 and processor(s) 710 may be configured collectively to perform the functions of blocks in flowcharts 500 and 550. Storage device 725 may be configured to store an intermediate result, such as a globally unique attribute or locally unique attribute discussed within any of blocks mentioned herein. Storage device 725 may also contain a database consistent with any of the present disclosures. The memory 735 may similarly be configured to record signals, representation of signals, or database values necessary to perform any of the functions described in any of the blocks mentioned herein. Results that may need to be stored in a temporary or volatile memory, such as RAM, may also be included in memory 735, and may include any intermediate result similar to what may be stored in storage device 725. One or more input devices 715 may be configured to receive wireless signals from satellites and/or base stations according to the present disclosures described herein. One or more output devices 720 may be configured to display images, print text, transmit signals and/or output other data according to any of the present disclosures.

The methods, systems, and devices discussed above are examples. Various embodiments may omit, substitute, or add various procedures or components as appropriate. For instance, in alternative configurations, the methods described may be performed in an order different from that described, and/or various stages may be added, omitted, and/or combined. Also, features described with respect to certain embodiments may be combined in various other embodiments. Different aspects and elements of the embodiments may be combined in a similar manner. Also, technology evolves and, thus, many of the elements are examples that do not limit the scope of the disclosure to those specific examples.

Specific details are given in the description to provide a thorough understanding of the embodiments. However, embodiments may be practiced without these specific details. For example, well-known circuits, processes, algorithms, structures, and techniques have been shown without unnecessary detail in order to avoid obscuring the embodiments. This description provides example embodiments only, and is not intended to limit the scope, applicability, or configuration of the invention. Rather, the preceding description of the embodiments will provide those skilled in the art with an enabling description for implementing embodiments of the invention. Various changes may be made in the function and arrangement of elements without departing from the spirit and scope of the invention.

Also, some embodiments were described as processes or methods depicted as flow diagrams or block diagrams. Although each may describe the operations as a sequential process or method, many of the operations can be performed in parallel or concurrently. In addition, the order of the operations may be rearranged. A process or method may have additional steps not included in the figure. Furthermore, embodiments of the methods may be implemented by hardware, software, firmware, middleware, microcode, hardware description languages, or any combination thereof. When implemented in software, firmware, middleware, or microcode, the program code or code segments to perform the associated tasks may be stored in a processor-readable medium such as a storage medium. Processors may perform the associated tasks.

Where components are described as being configured to perform certain operations, such configuration can be accomplished, for example, by designing electronic circuits or other hardware to perform the operation, by programming programmable electronic circuits (e.g., microprocessors, or other suitable electronic circuits) to perform the operation, or any combination thereof.

Having described several embodiments, various modifications, alternative constructions, and equivalents may be used without departing from the spirit of the disclosure. For example, the above elements may merely be a component of a larger system, wherein other rules may take precedence over or otherwise modify the application of the invention. Also, a number of steps may be undertaken before, during, or after the above elements are considered. Accordingly, the above description does not limit the scope of the disclosure.

Various examples have been described. These and other examples are within the scope of the following claims.

What is claimed is:

1. A method for detecting floor changes on a mobile device, the method comprising:
   using a first processing core of the mobile device to:
     monitor a pressure;
     determine a rate of change in the pressure over time exceeds a predetermined rate-of-pressure-change threshold;
     subsequently determine that the rate of change in the pressure over time no longer exceeds the predetermined rate-of-pressure-change threshold;
     write sensor data to a shared memory independently accessible by the first processing core and a second processing core, the sensor data indicative of a change in the pressure;
     determine the change in the pressure has exceeded a predetermined pressure-change threshold; and
     provide, to the second processing core, an interrupt indicative of the determination that the change in the pressure has exceeded the predetermined pressure-change threshold; and
   performing floor disambiguation based on the sensor data, wherein performing the floor disambiguation comprises using the second processing core of the mobile device to read the sensor data from the shared memory.

2. The method of claim 1, further comprising:
   receiving a time-to-live (TTL) validity period associated with the change in the pressure;
   determining that the TTL validity period associated with the change in the pressure has expired; and
   disregarding the rate of change in the pressure and the change in the pressure.

3. The method of claim 1, further comprising:
   determining the mobile device is located in an indoor venue;
   wherein performing the floor disambiguation is based, at least in part, on the determination that the mobile device is located in the indoor venue.

4. The method of claim 1, further comprising:
   determining a velocity of the mobile device exceeds a velocity threshold; and
   disregarding the pressure.

5. The method of claim 1, wherein the first processing core comprises a sensor core.

6. The method of claim 5, wherein the second processing core comprises an application core, and the sensor core uses less power than the application core.

7. The method of claim 1, wherein the floor disambiguation is further based on data received from one or more terrestrial wireless transceivers.

8. The method of claim 1, further comprising using the first processing core of the mobile device to provide, to the second processing core, an interrupt indicative of the determination that the rate of change in the pressure over time exceeds the predetermined rate-of-pressure-change threshold.

9. The method of claim 1, further comprising using the first processing core of the mobile device to obtained the predetermined pressure-change threshold from the shared memory.

10. A mobile device comprising:
    a sensor core configured to:
      monitor pressure;
      determine a rate of change in the pressure over time exceeds a predetermined rate-of-pressure-change threshold;
      subsequently determine that the rate of change in the pressure over time no longer exceeds the predetermined rate-of-pressure-change threshold;
      write sensor data to a shared memory independently accessible by the sensor core and a second processing core, the sensor data indicative of a change in the pressure;
      determine the change in the pressure has exceeded a predetermined pressure-change threshold; and
      provide, to the second processing core, an interrupt indicative of the determination that the change in the pressure has exceeded the predetermined pressure-change threshold; and
    an application core configured to perform floor disambiguation based on the sensor data, wherein performing the floor disambiguation comprises using the second processing core of the mobile device to read the sensor data from the shared memory.

11. The mobile device of claim 10, wherein the sensor core is further configured to:
    receive a time-to-live (TTL) validity period associated with the change in the pressure;
    determine that the TTL validity period associated with the change in the pressure has expired; and
    disregard the rate of change in the pressure and the change in the pressure.

12. The mobile device of claim 10, wherein:
the sensor core is configured to determine the mobile device is located in an indoor venue; and
the application core is configured to perform the floor disambiguation based, at least in part, on the determination that the mobile device is located in the indoor venue.

13. The mobile device of claim 10, wherein the sensor core is further configured to:
determine a velocity of the mobile device exceeds a velocity threshold; and
disregard the pressure.

14. The mobile device of claim 10, wherein the floor disambiguation is further based on data received from one or more terrestrial wireless transceivers.

15. The mobile device of claim 10, wherein the sensor core uses less power than the application core.

16. The mobile device of claim 10, wherein the sensor core is further configured to provide, to the second processing core, an interrupt indicative of the determination that the rate of change in the pressure over time exceeds the predetermined rate-of-pressure-change threshold.

17. The mobile device of claim 10, wherein the sensor core is further configured to obtain the predetermined pressure-change threshold from the shared memory.

18. A mobile device comprising:
a first processing means for:
monitoring pressure;
determining a rate of change in the pressure over time exceeds a predetermined rate-of-pressure-change threshold;
subsequently determining that the rate of change in the pressure over time no longer exceeds the predetermined rate-of-pressure-change threshold;
writing sensor data to a shared data storage means independently accessible by the first processing means and a second processing means, the sensor data indicative of a change in the pressure;
determining the change in the pressure has exceeded a predetermined pressure-change threshold; and
providing, to the second processing means, an interrupt indicative of the determination that the change in the pressure has exceeded the predetermined pressure-change threshold; and
the second processing means for performing floor disambiguation based on the sensor data, wherein the second processing means is configured to read the sensor data from the shared data storage means as part of performing the floor disambiguation.

19. The mobile device of claim 18, further comprising means for:
receiving a time-to-live (TTL) validity period associated with the change the in pressure;
determining that the TTL validity period associated with the change in the pressure has expired; and
disregarding the rate of change in the pressure and the change in the pressure.

20. The mobile device of claim 18, further comprising:
means for determining the mobile device is located in an indoor venue; and
means for performing the floor disambiguation based, at least in part, on the determination that the mobile device is located in the indoor venue.

21. The mobile device of claim 18, further comprising:
means for determining a velocity of the mobile device exceeds a velocity threshold.

22. The mobile device of claim 18, wherein the first processing means include a sensor core.

23. The mobile device of claim 22, wherein the second processing means includes an application core, and wherein the sensor core uses less power than the application core.

24. The mobile device of claim 18, wherein the floor disambiguation is further based on data received from one or more terrestrial wireless transceivers.

25. A non-transitory processor-readable medium comprising processor-readable instructions, comprising:
code configured to cause a first processing core of a mobile device to:
monitor pressure;
determine a rate of change in the pressure over time exceeds a predetermined rate-of-pressure-change threshold;
subsequently determine that the rate of change in the pressure over time no longer exceeds the predetermined rate-of-pressure-change threshold;
write sensor data to a shared memory independently accessible by the first processing core and a second processing core, the sensor data indicative of a change in the pressure;
determine the change in the pressure has exceeded a predetermined pressure-change threshold; and
provide, to the second processing core, an interrupt indicative of the determination that the change in the pressure has exceeded the predetermined pressure-change threshold; and
code for performing floor disambiguation based on the sensor data, wherein the code for performing the floor disambiguation is configured to cause the second processing core of the mobile device to read the sensor data from the shared memory.

26. The processor-readable medium of claim 25, further comprising:
code for receiving a time-to-live (TTL) validity period associated with the change in the pressure;
code for determining that the TTL validity period associated with the change in the pressure has expired; and
code for disregarding the rate of change in the pressure and the change in the pressure.

27. The processor-readable medium of claim 25, further comprising:
code for determining the mobile device is located in an indoor venue;
wherein the code for performing floor disambiguation includes code for basing the floor disambiguation, at least in part, on the determination that the mobile device is located in the indoor venue.

28. The processor-readable medium of claim 25, further comprising:
code for determining a velocity of the mobile device exceeds a velocity threshold; and
code for disregarding the pressure.

29. The processor-readable medium of claim 25, wherein:
the code configured to cause the first processing core of the mobile device to monitor the pressure over time, determine the rate of change in the pressure over time exceeds the predetermined rate-of-pressure-change threshold, subsequently determine that the rate of change in the pressure over time no longer exceeds the predetermined rate-of-pressure-change threshold, write sensor data to the shared memory, and determine the change in the pressure has exceeded the predetermined pressure-change threshold is configured to be executed using a sensor core; and wherein the code for performing floor disambiguation is configured to be executed using an application core, wherein the sensor core uses less power than the application core.

30. The processor-readable medium of claim 25, wherein the floor disambiguation is further based on data received from one or more terrestrial wireless transceivers.

\* \* \* \* \*